United States Patent
Falek et al.

(10) Patent No.: US 11,635,670 B2
(45) Date of Patent: Apr. 25, 2023

(54) DYNAMIC NEUTRAL DENSITY FILTER

(71) Applicant: Spectralics Ltd., Tel Aviv (IL)

(72) Inventors: Eran Falek, Netanya (IL); Yuval Kashter, Tel Aviv (IL); Ran Abraham Bar-Yosef, Tel-Aviv (IL)

(73) Assignee: Spectralics Ltd., Tel Aviv (IL)

( * ) Notice: Subject to any disclaimer, the term of this patent is extended or adjusted under 35 U.S.C. 154(b) by 0 days.

(21) Appl. No.: 17/490,609

(22) Filed: Sep. 30, 2021

(65) Prior Publication Data

US 2022/0019123 A1    Jan. 20, 2022

Related U.S. Application Data

(63) Continuation of application No. PCT/IL2020/050391, filed on Mar. 31, 2020.

(60) Provisional application No. 62/827,074, filed on Mar. 31, 2019.

(51) Int. Cl.
*G02F 1/35* (2006.01)
*H01L 49/02* (2006.01)

(52) U.S. Cl.
CPC ............ *G02F 1/3501* (2013.01); *H01L 28/40* (2013.01); *G02F 2202/10* (2013.01); *G02F 2203/48* (2013.01)

(58) Field of Classification Search
CPC ............... G02F 1/3501; G02F 2202/10; G02F 2203/48; H01L 28/40
See application file for complete search history.

(56) References Cited

U.S. PATENT DOCUMENTS

| | | | |
|---|---|---|---|
| 2005/0248830 A1 | 11/2005 | Sawin et al. | |
| 2007/0090751 A1* | 4/2007 | Cok | H01L 27/322 313/506 |
| 2013/0155492 A1* | 6/2013 | Shen | G02B 6/10 359/326 |
| 2013/0208332 A1* | 8/2013 | Yu | H01Q 15/10 977/773 |
| 2015/0168747 A1 | 6/2015 | Kadono et al. | |
| 2016/0111782 A1* | 4/2016 | Alu | H01Q 1/521 343/810 |
| 2016/0261086 A1* | 9/2016 | Pruneri | H01S 3/106 |
| 2018/0066991 A1* | 3/2018 | Mueller | H01Q 21/24 |
| 2018/0120595 A1* | 5/2018 | Joo | G02F 1/19 |

(Continued)

FOREIGN PATENT DOCUMENTS

JP    2009122606 A    6/2009

OTHER PUBLICATIONS

Buchnev et al., Electrically Controlled Nanostructured Metasurface Loaded with Liquid Crystal: Toward Multifunctional Photonic Switch, Adv. Optical Mater. 2015, 3, 674-679 (Year: 2015).*

(Continued)

*Primary Examiner* — Peter Radkowski
(74) *Attorney, Agent, or Firm* — Pearl Cohen Zedek Latzer Baratz LLP

(57) ABSTRACT

Described herein is a dynamic optical modulator including a plurality of pixels arranged in a grid, the pixels comprising a plurality of unit-cells, the unit-cell comprising a dielectric layer sandwiched between two at least partially conductive layers, wherein the optical characteristics of each of said unit-cells is controlled by the application of a voltage across each of the pixels of the plurality of pixels.

11 Claims, 12 Drawing Sheets

(56) References Cited

U.S. PATENT DOCUMENTS

| | | | |
|---|---|---|---|
| 2018/0217406 A1* | 8/2018 | Bonod | G02F 1/015 |
| 2018/0241131 A1* | 8/2018 | Akselrod | H01Q 3/44 |
| 2018/0246262 A1* | 8/2018 | Zhan | G02B 1/002 |
| 2018/0341090 A1* | 11/2018 | Devlin | C23C 16/45555 |
| 2019/0079321 A1* | 3/2019 | Wu | G02F 1/0555 |

OTHER PUBLICATIONS

Gruev, V., "Fabrication of a dual-layer aluminum nanowires polarization filter array," 2012 IEEE International Symposium on Circuits and Systems (ISCAS), 2012, pp. 3130-3133, doi: 10.1109/ISCAS.2012.6271985 (Year: 2012).*

Guo et al., Electrically Tunable Gap Surface Plasmon-based Metasurface for Visible Light, Scientific Reports, 7:14078, DOI: 10.1038/S41598-017-14583-7 (Year: 2017).*

Lee et al., "Broadband graphene electro-optic modulators with sub-wavelength thickness," Opt. Express 20, 5264-5269 (2012) (Year: 2012).*

Liu et al., Double-Layer Graphene Optical Modulator, Nano Lett. 2012, 12, 3, 1482-1485 Feb. 14, 2012, https://doi.org/10.1021/nl204202k (Year: 2012).*

Wang et al., Graphene-based functional devices: A short review, Frontiers of Physics 14(1), 13603, arXiv:1810.07487v2, Oct. 18, 2018. (Year: 2018).*

Wu et al., Tunable Metasurfaces: A Polarization Rotator Design, Phys. Rev. X 9, 011036—Published Feb. 22, 2019 (Year: 2019).*

Yang et al., "Broadband terahertz rotator with an all-dielectric metasurface," Photon. Res. 6, 1056-1061 (2018). (Year: 2018).*

Ye et al., "Electro-absorption optical modulator using dual-graphene-on-graphene configuration," Opt. Express 22, 26173-26180 (2014). (Year: 2014).*

C. Argyropoulos, "Enhanced transmission modulation based on dielectric metasurfaces loaded with graphene," Opt. Express 23, 23787-23797 (2015). (Year: 2015).*

Wang, S., Chou, JP., Ren, C. et al. Tunable Schottky barrier in graphene/graphene-like germanium carbide van der Waals heterostructure. Sci Rep 9, 5208 (2019). (Year: 2019).*

Yao et al., Electrically Tunable Metasurface Perfect Absorbers for Ultrathin Mid-Infrared Optical Modulators, Nano Lett. 2014, 14, 6526-6532 (Year: 2014).*

International Search Report for PCT Application No. PCT/IL2020/050391, dated Oct. 13, 2020.

Liu et al. "Double Layer Graphene Optical Modulator", Nano Letters Feb. 14, 2012, vol. 12, pp. 1482-1485.

Extended European Search Report for EP Application No. 20783926.7, dated Feb. 8, 2022.

* cited by examiner

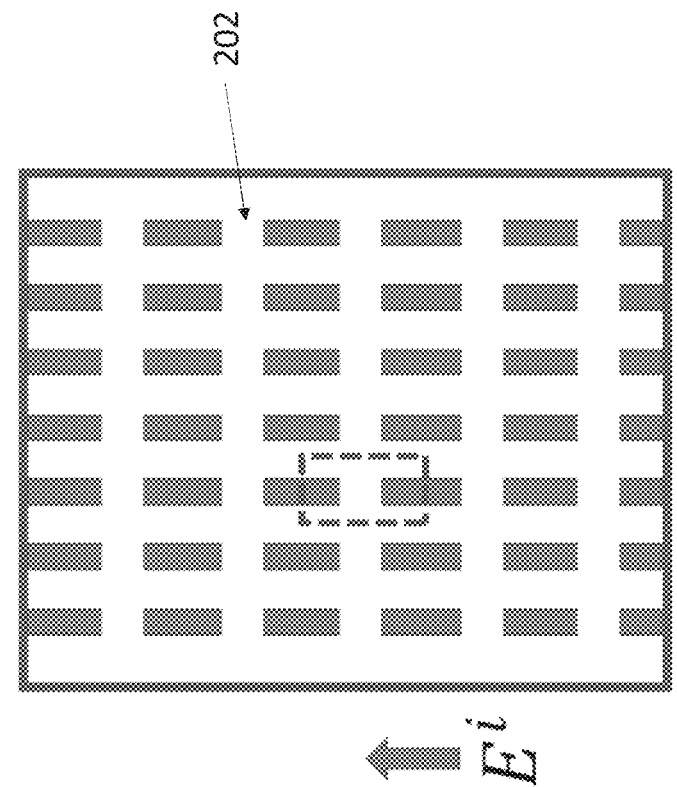
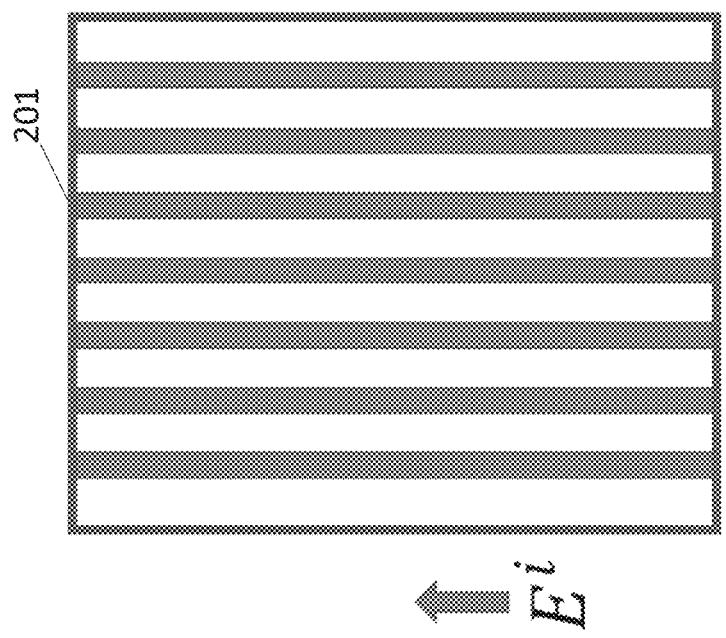

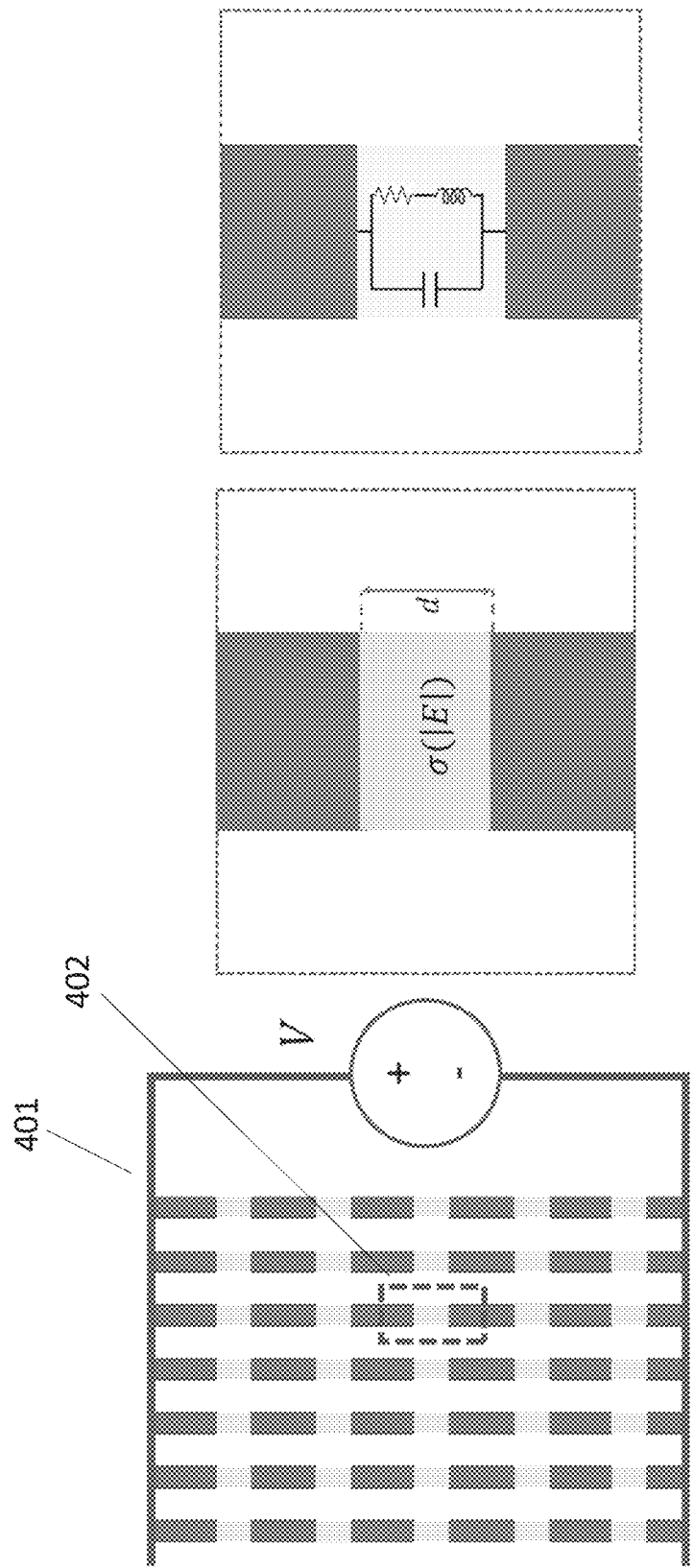

DYNAMIC NEUTRAL DENSITY FILTER

CROSS REFERENCE TO RELATED APPLICATIONS

This application is a continuation of PCT Application no. PCT/IL2020/050391 filed on Mar. 31, 2020, which claims benefit of U.S. Provisional Patent Application No. 62/827,074 filed on Mar. 31, 2019, both are incorporated herein by reference in their entireties.

FIELD OF THE INVENTION

The present invention relates to two-dimensional (2D) versions of metamaterials called metasurfaces. The present invention describes a dynamic metasurface structure—the dynamic neutral density filter (DNDF)—based on non-linear materials, for enhanced control over light transmissivity/reflectivity.

BACKGROUND OF THE INVENTION

Controlling the transmissivity (and/or the reflectivity) of transparent surfaces is very useful for a variety of applications, varying from window shading in one's home, to complex projectors and optical display systems. Nowadays, three main methods are used to achieve the above-mentioned purpose: photochromic materials (PC), electro-chromic materials (EC), and liquid crystals (LC).

Photo-chromic materials are transparent surfaces, commonly used in eyeglasses, that change their transmissivity with reaction to the ambient light power. These materials have a relatively long transition time from light to dark, and vice versa (of the order of a few seconds). In addition, they can only be controlled by environmental conditions and not by a control system.

Electro-chromic materials change their transmissivity as a response to an electrical voltage. Thus, these materials can be controlled as desired via a control system. In addition, some of these materials can exhibit transition times of less than a second. However, EC materials result in an observed scene which is tinted, as they affect the colors which are transferred, both in dark and bright states. Moreover, the attenuation occurs on the entire surface, rather than on a selective area: In other words, one cannot attenuate a specific region of interest on a surface while the rest of the surface remains bright.

Liquid crystals are surfaces which include ellipsoidal particles which change their orientation with respect to an applied voltage. By doing so, the structure behaves as a polarization rotator, which in combination with an additional polarizer can attenuate the transmitting light locally. The transition rate of an LC screen is very fast (normally of the order of milliseconds), and the attenuation can vary from 50% to a complete blockage. One drawback of LCs, however, is that the maximum transmissivity is only 50%, which might be too low for certain applications. In addition, the pixel size (on which a gridded liquid crystal display (LCD) is based) is limited to a minimal size of a few microns. Consequently, the pattern of the LCD surface has a periodicity pitch of a few microns, larger than the wavelength of light in the visible range, which might result in scattering effects and chromatic aberrations.

In many optical applications, and in particular in a variety of imaging systems spanning the entire spectral range, there is a need to control the intensity of light in a localized manner. One example exists in bolo-metric sensors (i.e. thermal sensors). In a case where a hot object is imaged by a thermal camera, the sensor may be saturated, affecting the dynamic range of the sensor. Moreover, in some cases it may cause prolonged damage to the sensor, an effect which is commonly referred to as the "sunburn" effect. Similarly, in the visible range, a bright object can saturate a picture captured in a charge-coupled device (CCD) camera (see FIG. 1A). If one can attenuate the light transmitted in the area in which the intensity is too high, the above-mentioned saturation would be prevented, and the picture captured would be balanced, as shown in FIG. 1B.

In addition, dynamic local attenuators, such as Liquid Crystal Displays (LCDs), are widely in use for projection systems. As mentioned above, these local attenuators have a typical pixel size of a few microns, which results in limited geometrical resolution, light scattering, diffraction, and rainbow effects. LC-based spatial light modulators (SLMs), and in particular phase-only SLMs, which are also dynamic, are mostly used for digital holography applications. In these applications, the pixel size dictates the spatial angles which can be controlled; thus, the efficiency and quality of the holograms are directly affected by the relatively limited geometrical resolution, derived by the large pixel size. Digital Micro-mirror Devices (DMDs) also provide phase modulation by shaping the phase pattern that is reflected using a grid of tilted mirrors. However, similar to LCDs, the minimal size of each mirror is also of the scale of microns.

In the last three decades there has been growing interest in the field of metamaterials. Metamaterials are advanced engineered structures that can manipulate waves in all spectral ranges. They consist of engineered periodic structures having a period (also denoted as a unit-cell) much smaller than the wavelength of the incident light. As a result, the incident fields cannot resolve the details of the structure and, instead, interact with the metamaterial as if the light were meeting a bulk material with effective parameters (e.g., permittivity, permeability or conductivity). The ability to select materials, and design the geometry, of the unit-cell allows one to determine effective properties and even obtain parameters which do not exist naturally (e.g. negative refractive index). Furthermore, by using non-linear materials inside the unit-cell, one can control the effective parameters by applying biased electric fields to said materials.

The present invention relates to two-dimensional (2D) versions of metamaterials called metasurfaces. The idea of tunable metasurfaces has already been presented before in different academic studies, for example: mechanical tunable materials, thermally responsive materials, optically driven surfaces, and electrically tunable metamaterials. The present invention provides a dynamic metasurface structure, based on non-linear materials, for enhanced control of light transmissivity.

According to some embodiments of the present invention, part of the third "depth" dimension is utilized in a "synaptic" structure having analogy to biological synapses in the human nervous system. Synapse is a Greek term meaning "conjunction," employed to describe the union of two separate elements. It is such a structure that is intended to be emulated within the layers of the DNDF. In electrical synapses, as opposed to chemical synapses, the pre-synaptic and post-synaptic cell membranes are connected via gap junctions capable of passing an electric current, causing a change in electric potential in the pre-synaptic cell which in turn goes on to induce a change in potential in the post-synaptic cell. The main advantage of an electrical synapse is seen in its ability to rapidly transfer signals between adjacent cells. In the case of the present invention an analogous set-up is placed within a dielectric material, thin transparent conductors taking on the role of individual synapses, the geometry of the conductors forming a capacitor structure within the dielectric.

The dynamic range of the present invention is rail to rail, i.e. it can change from near-complete transmission to complete blockage (complete reflection). In addition, transition times from transmission to blockage (reflection) are typically less than a millisecond. The greatest advantage of the structure, however, lies in the size of the unit-cell. Since the unit-cells are smaller than the incident wavelength, one can set a periodic structure size of less than a micron for the visible spectrum. In doing so the surface remains lucid, completely transparent, and does not exhibit scattering effects.

SUMMARY OF THE PRESENT INVENTION

According to a first aspect of the present invention there is provided a dynamic optical modulator comprising a plurality of pixels arranged in a grid, said pixels comprising a plurality of unit-cells, said unit-cell comprising a dielectric layer sandwiched between two at least partially conductive layers, wherein the optical characteristics of each of said unit-cells is controlled by the application of a voltage across each of said pixels of the plurality of pixels.

According to some embodiments of the invention, the unit-cell comprises non-linear materials.

According to some embodiments of the invention, said partially conductive layers comprise doped semi-conductor material.

According to some embodiments of the invention the dynamic optical modulator further comprises a capacitor structure in a plane perpendicular to said conductive layers.

According to some embodiments of the invention the capacitor structure comprises two layers of a transparent material.

According to some embodiments of the invention, the capacitor structure comprises a layer of semi-conductor material between said two layers of transparent material.

According to some embodiments of the invention, the capacitor structure comprises two layers of at least one of the following materials: indium tin oxide; aluminum doped Zinc oxide (AZO); Indium doped cadmium oxide (ICO); Polymers: Poly(3,4-ethylenedioxythiophene) (PEDOT); Poly(4, 4-dioctyl cyclopentadithiophene) can be doped with iodine or 2,3-dichloro-5,6-dicyano-1,4-benzoquinone (DDQ); Carbon nanotubes (CNT); and Graphene.

According to some embodiments of the invention, the non-transparent material comprises one of: silicon; germanium; aluminum oxide; gallium arsenide; and silicon carbide.

According to some embodiments of the invention, the unit-cell comprises an optically transmissive state and an optically non-transmissive state.

According to some embodiments of the invention, the application of a voltage across said pixel is varied to vary an electric field strength across said unit-cell.

According to some embodiments of the invention, a dimensional size of each of said plurality of unit-cells is smaller than an operating wavelength of said dynamic optical modulator.

According to some embodiments of the invention a dimensional size of each of said plurality of unit-cells is smaller than $\lambda/2$ at an operating wavelength $\lambda$ of said dynamic optical modulator.

According to some embodiments of the invention, a dimensional size of each of said plurality of unit-cells is smaller than $\lambda/3$ at an operating wavelength $\lambda$ of said dynamic optical modulator.

According to some embodiments of the invention, each of said plurality of unit-cells are smaller than $\lambda/4$ at an operating wavelength $\lambda$ of said dynamic optical modulator.

BRIEF DESCRIPTION OF THE DRAWINGS

FIG. 1A shows specifically a saturated image due to blinding/saturation from the sun's brightness. FIG. 1B shows specifically a balanced picture with full dynamic range;

FIGS. 2A and 2B are schematic illustrations of the two basic states of a structure, according to an embodiment of the invention. FIG. 2A illustrates specifically the on-state, based on a wire-grid polarizer. The structure reflects an incident electric field parallel to the structure. FIG. 2B illustrates specifically a truncated wire grid, which behaves as an effective permittivity. The geometrical properties are chosen such that the effective permittivity obtained is very similar to that of the host material;

FIG. 3A relates specifically to the wire-grid structure, where the electric field is fully reflected. FIG. 3B relates specifically to the truncated grid structure, where the electric field is transmitted according to the materials' mismatch parameters;

FIGS. 4A-4C are schematic illustrations of electrical voltage being applied to the truncated wire grid (pixel 401), according to embodiments of the present invention. FIG. 4A shows specifically a single pixel structure, 401, where the truncated metal wire grid inside the pixel is biased by an electrical voltage source, which applies strong electric fields on a material with non-linear parameters, shown in gaps in the metal wires. FIG. 4B shows specifically a detailed view of a single unit-cell (UC), 402, in the structure, shown in dashed rectangle in FIG. 4A. FIG. 4C shows specifically the equivalent circuit model for a single UC. The values of the capacitor, inductor and resistor are dependent on the bias voltage applied to the individual pixel;

FIG. 9A is a cross-sectional view of switch type 1 and FIG. 9B is a cross-sectional view of switch type 2;

DETAILED DESCRIPTION OF THE INVENTION

Figure 1B:
FIGS. 1A and 1B illustrate a scene view as captured through a charge-coupled device (CCD) camera, according to the prior art.
Figure 1A:
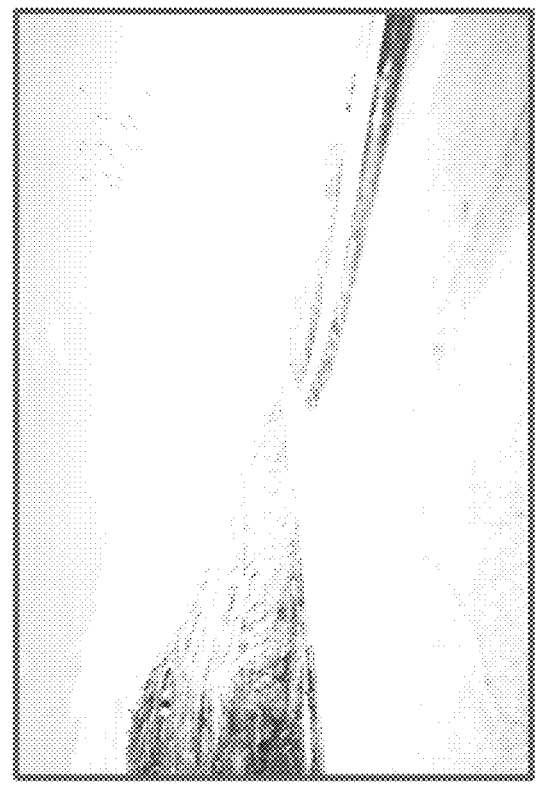

Before explaining the embodiments of the invention in detail, it is to be understood that the invention is not limited in its application to the details of construction and the arrangement of the components set forth in the following descriptions or illustrated in the drawings. The invention is applicable to other embodiments and may be practiced or carried out in various ways. Also, it is to be understood that the phraseology and terminology employed herein is for the purpose of description and should not be regarded as limiting.

The following term definitions are provided to aid in construal and interpretation of the invention.

The term "active area" refers generally to the portion and/or fraction of an item/article which fulfils an optical function when utilized. In the present context, an active area may refer to the portion of a layer in a metasurface which has been modified to perform, alone or in combination with other layers, an optical function (e.g., polarization, reflection, modulation, or the like). An active area is typically formed as a continuous undistributed shape, for example in the form of a circular or elliptical ring and may align with other active areas in other layers to collectively form a composite aperture/interface.

As will be appreciated by one skilled in the art, aspects of the present invention may be embodied as a system or an apparatus. Accordingly, aspects of the present invention may take the form of an entirely hardware embodiment or an embodiment combining software and hardware aspects that may all generally be referred to herein as a "circuit," "module" or "system".

With specific reference now to the drawings in detail, it is stressed that the particulars shown are for the purpose of example and solely for discussing the preferred embodiments of the present invention and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the invention may be embodied in practice.

The Dynamic Neutral Density Filter (DNDF) in its basic form is a local attenuator/modulator of the light which passes through it. Similar to Liquid Crystal Displays "LCDs", the surface is divided into pixels, which are divided further into sub-pixels or rather unit-cells, in which the transmissivity of the light is controlled by voltages. However, since the unit-cell surface is based on a sub-wavelength structure, the typical sub-pixel or unit-cell size is less than a micron, and therefore, no scattering or diffraction effects will occur. The structure consists of a uniform arrangement of sub-wavelength sub-pixels or unit-cells (UCs), hereinafter, which can be controlled by an applied voltage, and locally change their optical properties (in particular their transmission/reflection efficiency). This makes it a classical form of a dynamic metasurface. Since the unit-cell size is less than the operating wavelength, any light incident on this surface will interact with it as if the surface were a bulk material with macroscopic effective parameters. The geometry of the structure, however, allows one to engineer the effective material properties according to any desired specification.

In order to provide the ability to dynamically control the UCs by applying a voltage, non-linear materials are used inside every UC. A group of UCs is assigned as a pixel of the DNDF which can be switched between two states. One state is the off-state, in which no voltage is applied, and the surface of the pixel is transmissive. The other state is the on-state, in which an electric voltage is applied on the pixel and the surface of the pixel becomes reflective. Different levels of reflectivity/transmissivity can be achieved using Pulse Wave Modulation (PWM) between the two states. In its basic form, the DNDF is an ultra-high geometrical resolution amplitude modulator (i.e. amplitude SLM with a sub-pixel, or unit-cell, size of sub-microns). However, similar to the use of LCDs in phase-only SLM, some DNDF layers may be stacked to create a phase modulator in an advanced configuration.

A full explanation as to the functionality of the DNDF is two-part. Firstly, the static states of the structure, i.e. the on- and off-states, are described. The two states are illustrated as two distinct structures in FIG. 2. Each structure represents a single pixel of the DNDF, where a tile of pixels composes the entire structure. Following understanding of this, the second stage of explanation is to describe the switching mechanism which allows one to alternate between the two states by applying an electrical voltage. For this, a typical embodiment of the UC is described (see ahead to FIG. 4), as well as the non-linear phenomena. The UC can be realized using a different geometry, and the non-linearity may be attributed to different parameters of the materials as well. Thus, the structure described should not be considered limiting.

For an explanation of the static states, consider the structure of FIG. 2A. The dark lines of the illustration, 201, represent metallic lines of wires printed on an arbitrary substrate. The spacing between the wires is less than $\lambda/2$ at the operating frequency. For simplicity this may be considered a two-dimensional, 2D, structure, where the third dimension of depth is neglected. It is known that if an electric field is incident parallel to the wires, it will be entirely reflected. The amount of reflection is dependent on the absorption of the metal at the specific wavelength. An incident electric field perpendicular to the wires, however, would be transferred/transmitted through the structure. Since this structure transfers/transmits or reflects light in accordance with the Cartesian polarization directions, it is termed "the wire-grid polarizer". The wire-grid polarizer transfers/transmits or reflects a specific polarization. The physics behind the reflection phenomenon is that the incident electric field induces electric currents on the wires, which in-turn contribute to create a strongly scattered electric field. In the other polarization, the current lines are cut off. The wire-grid structure is the basic structure that describes the on-state.

In order to achieve the off-state, one can truncate the wires, i.e. create gaps 202, as shown in FIG. 2B. Similar to the perpendicular polarization, the truncated lines do not support a continuous current line. Instead, in each unit cell, which is smaller than a wavelength, there is a dipole response to the electric field. An array of dipoles can be described macroscopically as an effective permittivity. However, unless the unit-cell is extremely small (generally speaking, less than $0.1\lambda$), one cannot achieve a significant deviation from the host material. In the present case, the unit-cell is of the order of $\lambda/3$. Thus, the truncated wire grid will result in a refractive index similar to the host material; i.e. the incident field will be transmitted, unaffected by the structure, in accordance with the host material refraction parameters.

Figure 3B:
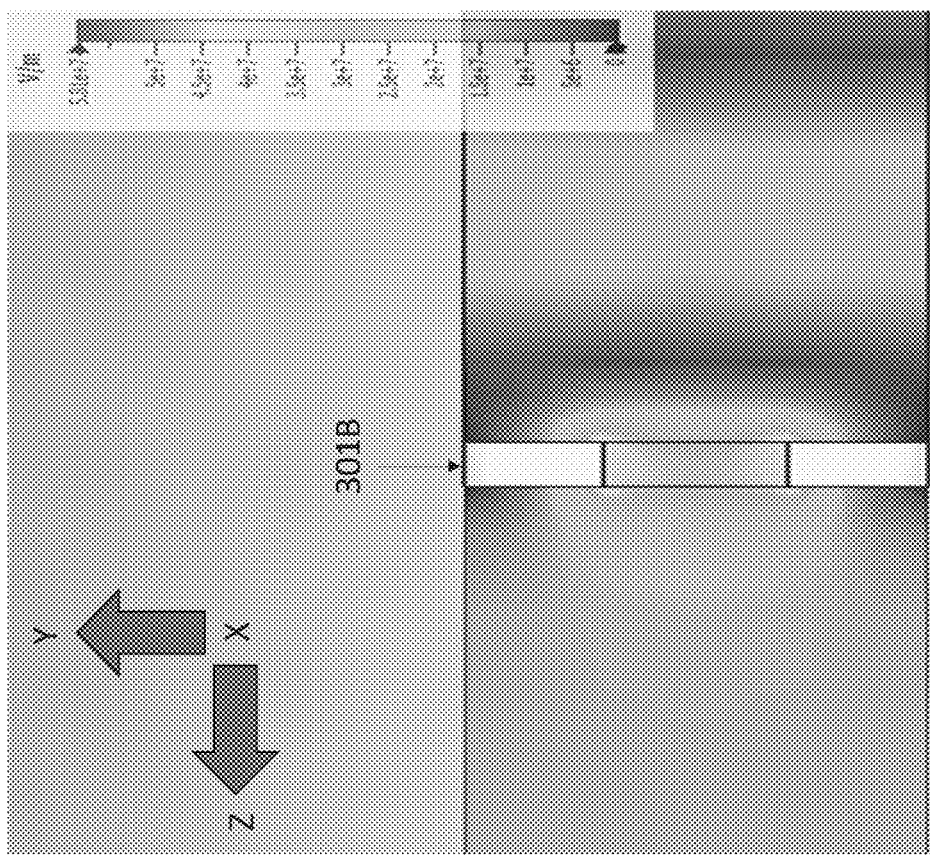
FIGS. 3A and 3B are finite difference time domain (FDTD) simulations of the two states shown in FIGS. 2A and 2B, respectively, according to embodiments of the present invention. The excitation is a plane wave propagating in the positive z direction. The medium on the right-hand side of area 301A and 301B is silicon and that on the left of area 301A and 301B, is vacuum.
Figure 3A:
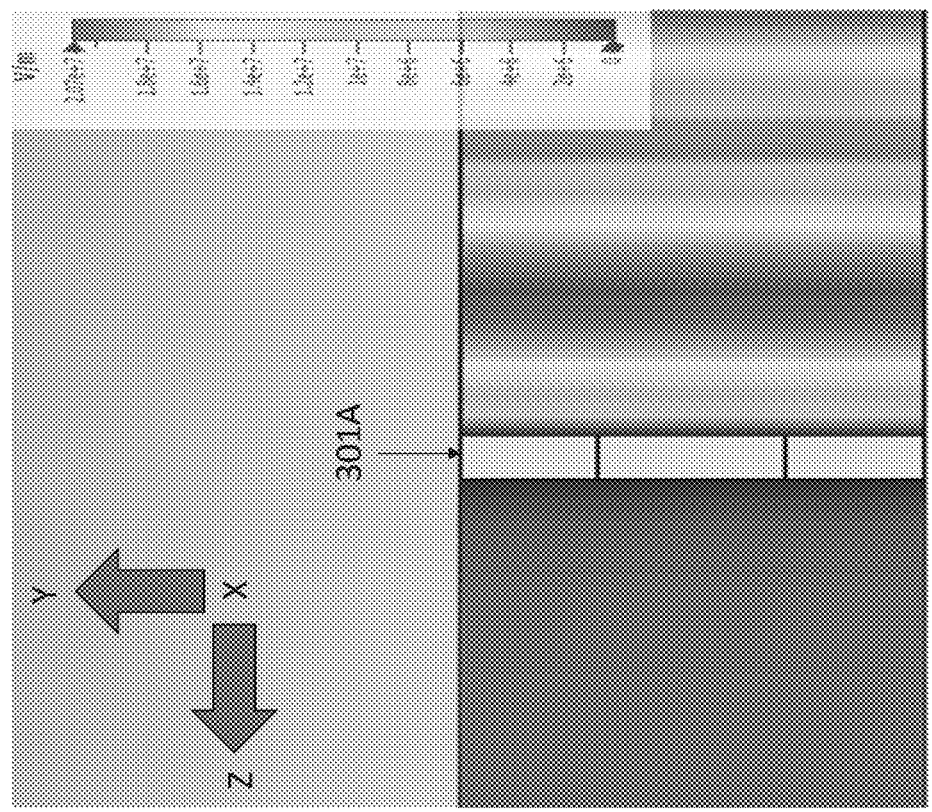

FIG. 3 shows a finite difference time domain (FDTD) simulation of the two states. In both cases, the excitation occurs by a plane wave propagating in the positive z direction. In FIG. 3A one can see that the fields after the metallic structure (represented by the grey rectangle 301 in the centre) vanish, and as a result, a standing wave is seen on the right-hand side. The standing wave indicates that the light is reflected from the structure (on-state). In FIG. 3B, however, one can see that the fields on the left-hand side, i.e. the transmitted fields, do not vanish. On the right-hand side of FIG. 3B one can also see a standing wave, indicating that a minor part of the power is still reflected due to the mismatch between the materials used (silicon on the right, and vacuum on the left).

The truncated grid structure of FIG. 2B is connected to a voltage source to define a single pixel of the DNDF, as illustrated in FIG. 4A. Since the grid does not allow DC current flow in the wires, there is no power consumption in the off-state. As the voltage is increased, strong electric fields are introduced in the gaps between the conductors. In these gaps, a special structure called the synaptic is placed, represented by the lighter, or rather the gap, area in FIG. 4B. This structure utilizes the depth dimension in order to increase the electric fields on a low-loss dielectric material in order to set it outside its linear conductivity region. The full structure is explained later below.

For a linear conductor, the current is proportional to the electric field, i.e.

$$J = \sigma E \quad (1)$$

However, there is a threshold of the electric field strength, in which the conductor is no longer linear. In that case, the current is an arbitrary function of the field. However, this region can be modeled by using $\sigma(|E|)$ in Eq. (1). In other words, the powerful fields between the conductors can alter parameters such as the permittivity or conductivity as a function of the field magnitude, which is proportional to the voltage applied between the terminals presented in FIG. 4A. In the case of the present invention, consideration is given mainly to changing the conductivity, but this should not be considered limiting. When the conductivity in the gaps rises, the non-linear material switches its functionality between being an isolator and a conductor (or a resistor). Electrical currents are then introduced in the gaps (and thus also static power consumption). The unit-cell structure shown in FIG. 4B can be modeled by an equivalent circuit shown in FIG. 4C. In the case where the bias voltage is zero, the resistance is very large and the resistor-inductor "RL" branch remains as an open circuit. Once a bias voltage is applied, the resistor value decreases significantly, and currents are introduced at the resistor-inductor "RL" branch of the circuit. Changing other parameters, for example, the permittivity, is equivalent to changing the capacitor value.

Figure 5B:
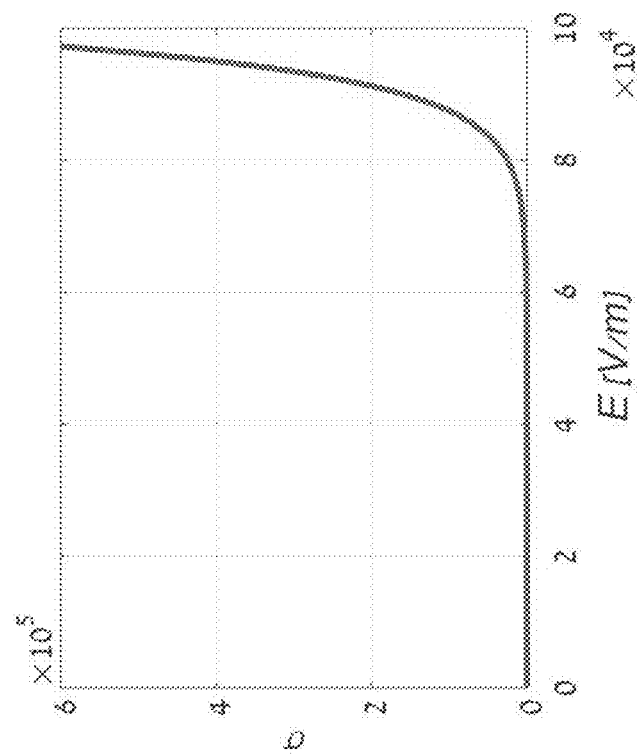
FIG. 5A is a schematic illustration for a unit cell static simulation, the structure having parameters a=b=3 µm, c=d=e=1 µm, according to embodiments of the present invention. The ambient medium is vacuum, while the non-linear material has a relative permittivity $\epsilon_r=5$, and the conductivity represented by $\sigma(|E|)$ is a non-linear function which is shown in FIG. 5B, said figure being a plot of the electrical conductance of the material in the gap as a function of the electric field magnitude. A non-linear model of the conductivity has been used.
Figure 5A:
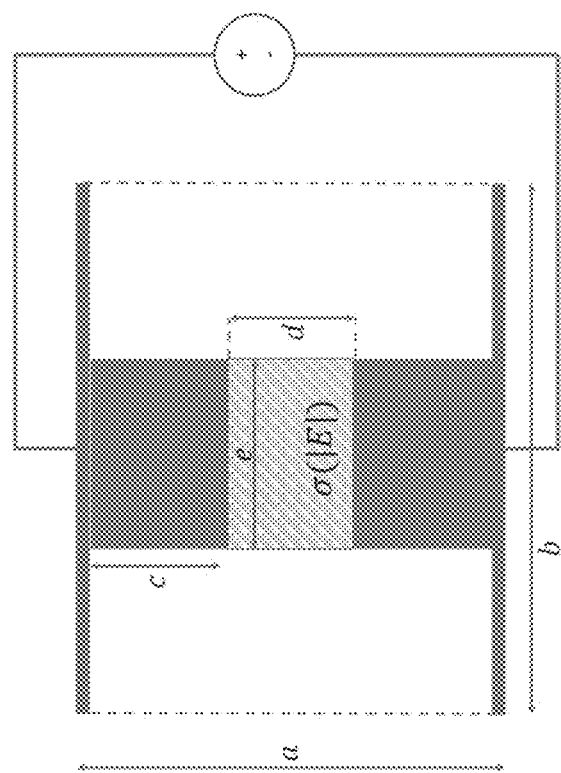

The magnitude of an incident field on the biased structure in FIG. 4A is significantly smaller than the bias fields in the gaps. Thus, the change in the conductivity due to incident fields is negligible. In other words, depending on the bias point selected by the voltage source, the incident field is interacting with an effective material with linear parameters. For demonstration, a static simulation of a pixel consisting of a single unit-cell, periodic in the x direction, is performed. Here, the special structure in the gap is ignored for the sake of simplicity and is just considered to act as a bulk material. The structure is shown in FIG. 5A, and the parameters chosen for the simulation were: a=b=3 µm, c=e=1 µm, which implies that d=1 µm as well. The ambient medium is vacuum, while the non-linear material has a relative permittivity $\epsilon_r=5$, and the conductivity represented by $\sigma(|E|)$ is a non-linear function, which is shown in FIG. 5B. Although one can use different models for representation of the non-linear conductivity, the model of the conductivity is formulated by the following mathematical expression $$\sigma(|E|) = \sigma_0 (e^{\alpha(E-E_0)} + 1), \quad (2)$$

where $\sigma_0 = 1 \times 10{-4}$, $\alpha = 1.842 \times 10{-4}$ and $E_0 = 2.5 \times 10^4$. The dashed line in FIG. 5A represents periodic boundary conditions.

Figure 6:
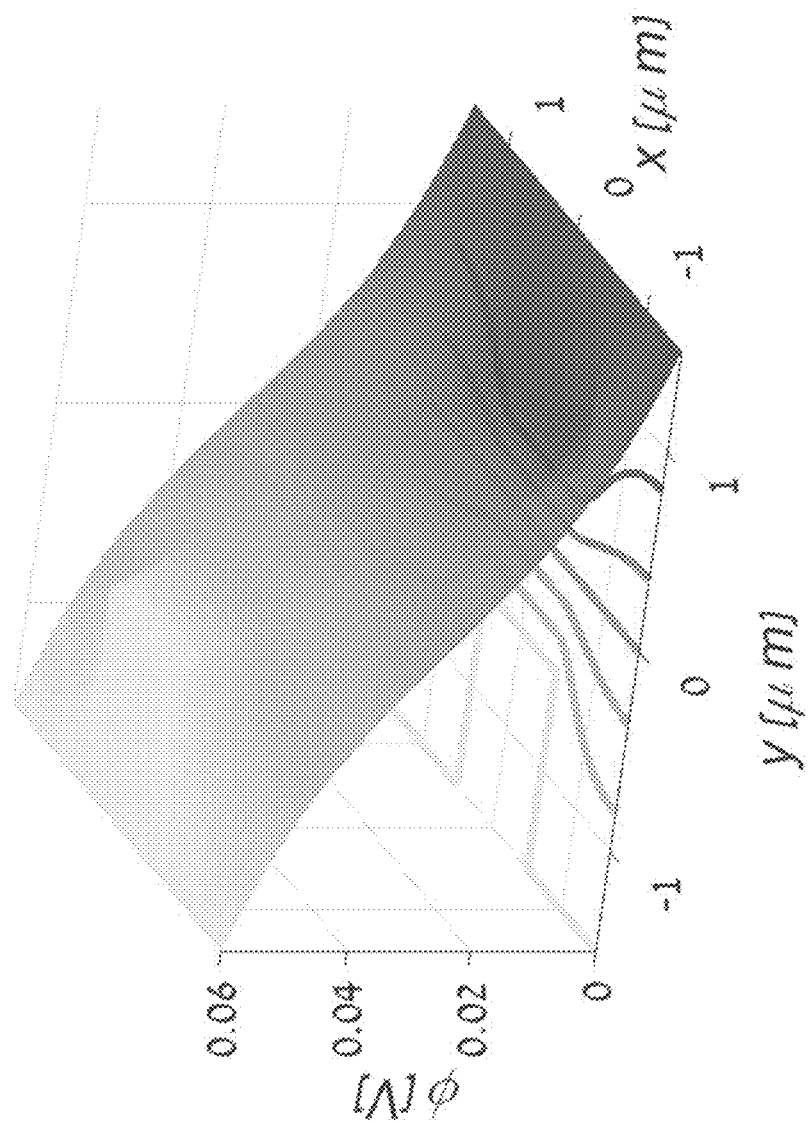
FIG. 6 is a plot of the electric potential in the unit-cell in a static simulation using the following parameters: V=0.06 volts, $\epsilon_r=5$, a=b=3 µm, c=e=1 µm and d=according to embodiments of the present invention.

The resulting electric potential $\phi$ for a voltage of 0.06 volts is shown in FIG. 6. The potential in the gap is linear in y and thus the field is constant and given by $E(y) = -V/d$. The equivalent circuit parameters are $R = 16 \, \Omega/m$, $L = 9.6 \times 10^{-14} H/m$, and $C = 9.1 \times 10^{-16} F/m$. For comparison, if the voltage is 0.001V, the resistor would be $R = 4.2 M\Omega/m$.

Figure 7:
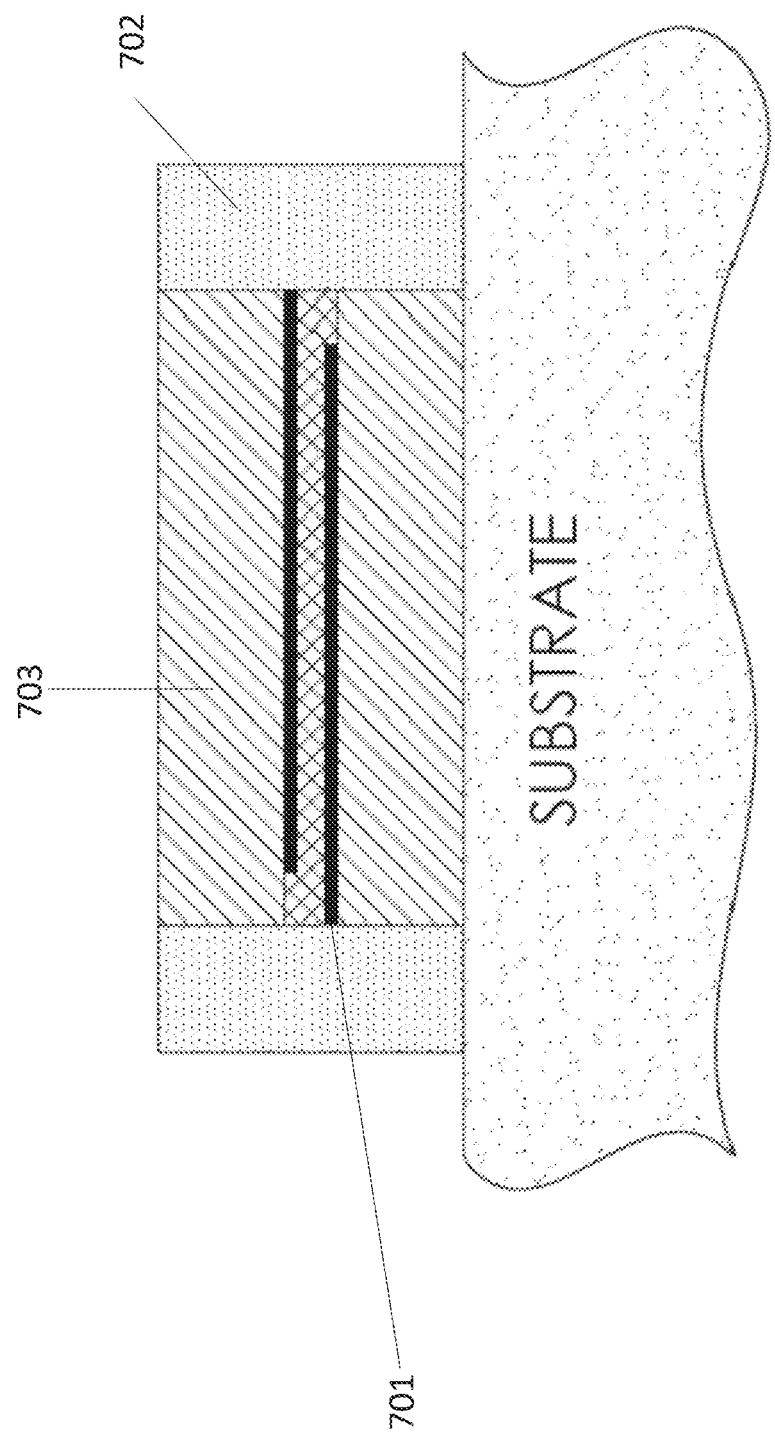
FIG. 7 is a schematic illustration of the synaptic structure, according to embodiments of the present invention. The black lines, 701, are thin conductors, or transparent conductors, which create a capacitor structure in the depth dimension. The material between them is a dielectric material whose conductivity can be changed using strong electric fields. The dotted are, 702, represents the metallic conductors of the truncated rods, whilst the material 703 may be silicon.
Figure 8:
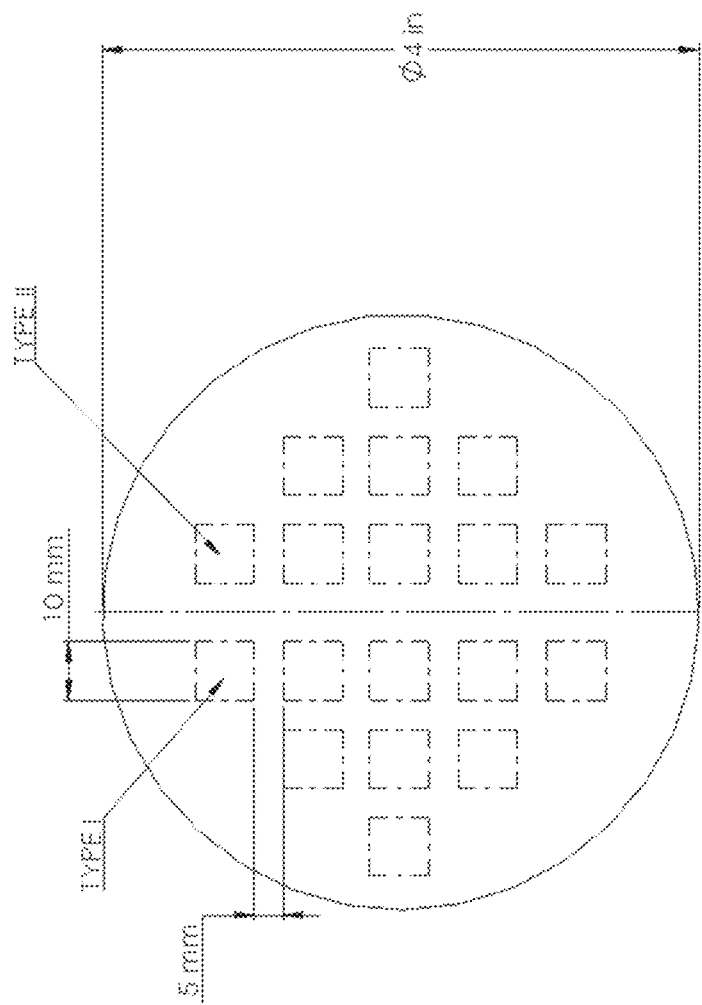
FIG. 8 is an illustration of the layered synaptic structure, according to embodiments of the present invention.

Described now is a method to utilize the depth dimension of the area between the conductors in order to increase the field magnitude. Common dielectric materials, such as silicon dioxide, aluminum oxide, or even semiconductors such as silicon and germanium, have a material property called dielectric strength. The dielectric strength is the field magnitude at which the material starts conducting. This property is also referred to as the material's breakdown voltage. For oxides, the dielectric strength has order of magnitude of $10^7$ V/m. Once this field strength is exceeded, the material properties change, and this process is irreversible. Therefore, in order to be in a non-linear conductance region of these materials, one must be close to this value. As shown in the previous example, the field's magnitude on the non-linear part was of order of magnitude $10^5$. In order to increase the possible fields one can apply on the materials, the structure shown in FIG. 7 is submitted. In FIG. 7 a cross section of the area between the conductors is shown. Two thin and transparent conductors (such as Indium tin oxide "ITO" on the scale of a few nanometers to tens of nanometers) create a capacitor structure in the depth dimension. Other transparent conductors include at least the following materials, although this list is not exhaustive: aluminum doped Zinc oxide (AZO); Indium doped cadmium oxide (ICO); Polymers: Poly(3,4-ethylenedioxythiophene) (PEDOT); Poly(4,4-dioctyl cyclopentadithiophene) can be doped with iodine or 2,3-dichloro-5,6-dicyano-1,4-benzoquinone (DDQ); Carbon nanotubes (CNT); and Graphene.

The conductors are thin, such that their impact on the transmission in optical frequencies is minimal. One can also use transparent conductors such as ITO which conduct DC but have low absorption at optical frequencies. This structure allows one to reduce the distance between the conductors in a controllable manner. For example, a 1V voltage on a spacing of 10 nm would result in a field of 108V/m. For this reason, one can set the voltages such that they can alter the free carrier concentration in the material and come close to the breakdown voltage. A resistor is created therefore, in the small gap between the conductors.

FIG. 9 illustrates two designed multi-layered structures which were fabricated using ion beam sputtering deposition using an Intivac machine. The structures were fabricated on top of a silicon wafer as the substrate.

The deposition process is set out in Table 1 below:

TABLE 1

| Step No. | Material | Thickness [nm] | Comments |
| --- | --- | --- | --- |
| 1 | Si | 100 | |
| 2 | ITO | 10 | |
| 3 | Si | 20 | Only on the type I switches |
| 4 | Si | 80 | Only on the type II switches |
| 5 | ITO | 20 | |
| 6 | Si | 100 | |
| 7 | Ag | 330 | |

Figures 9A, 9B:
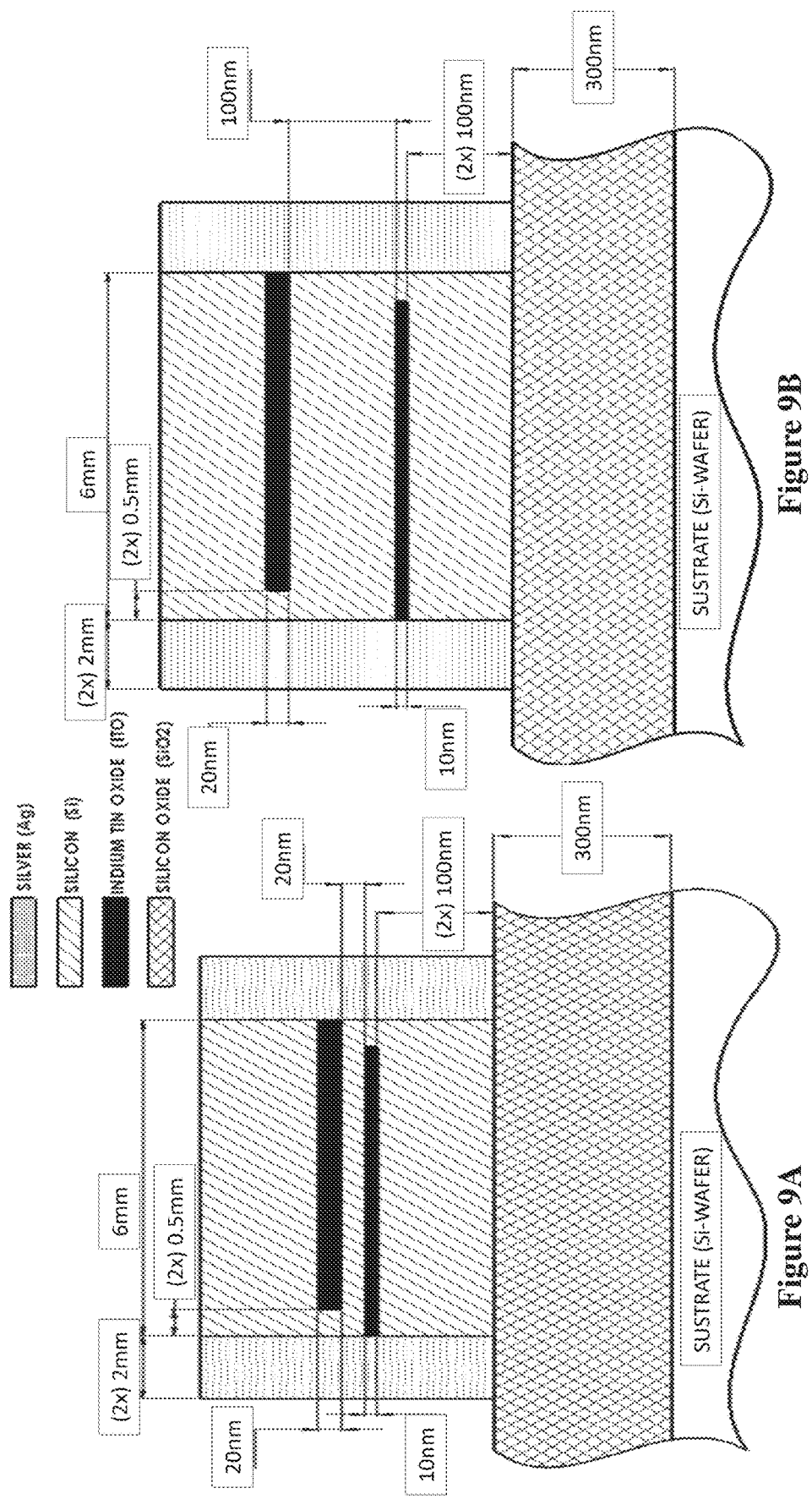
FIGS. 9A and 9B illustrate two versions of switches designed according to the layered structures illustrated in FIG. 8, according to embodiments of the present invention.

FIGS. 9A and 9B illustrates the footprint of the two switches, wherein FIG. 9A illustrates type 1(I) and FIG. 9B illustrates type 2(II).

Figure 10:
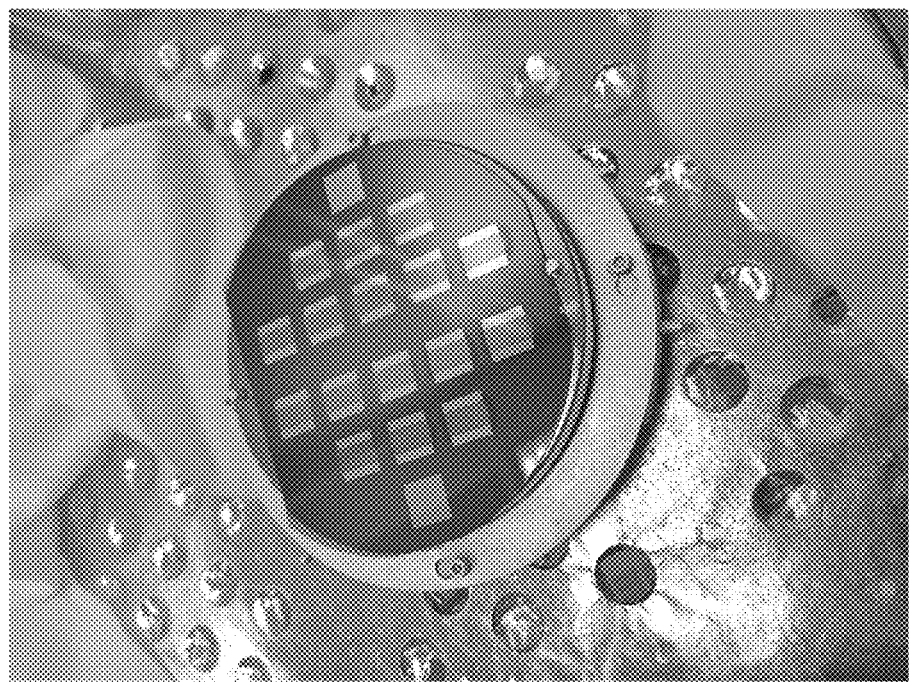
FIG. 10 is a photograph of the two switches fabricated on a silicon substrate, according to embodiments of the present invention.

FIG. 10 is a photograph of the fabricated optical switches.

Figure 11:
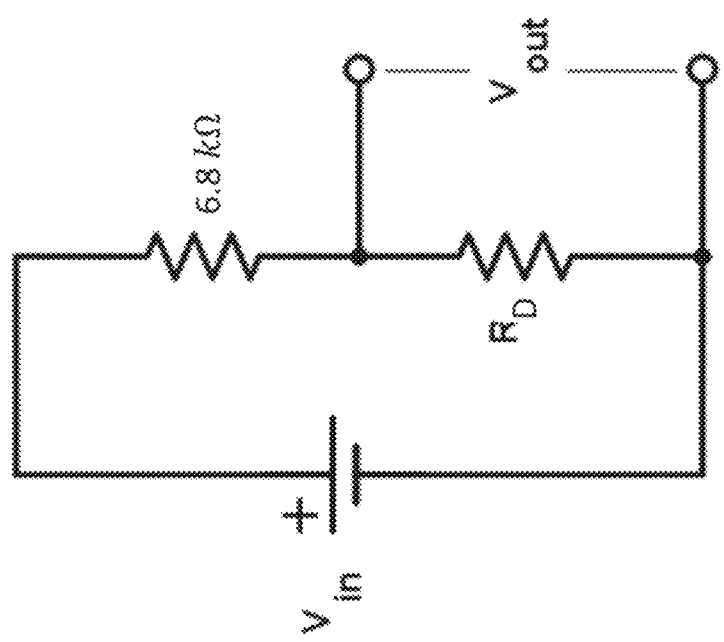
FIG. 11 illustrates the circuit scheme to which the fabricated structure is connected, according to embodiments of the present invention.

In order to test the fabricated structures, the circuit shown in FIG. 11 was constructed. The structures were connected to the circuit and different DC voltages were applied to the switches.

Figure 12:
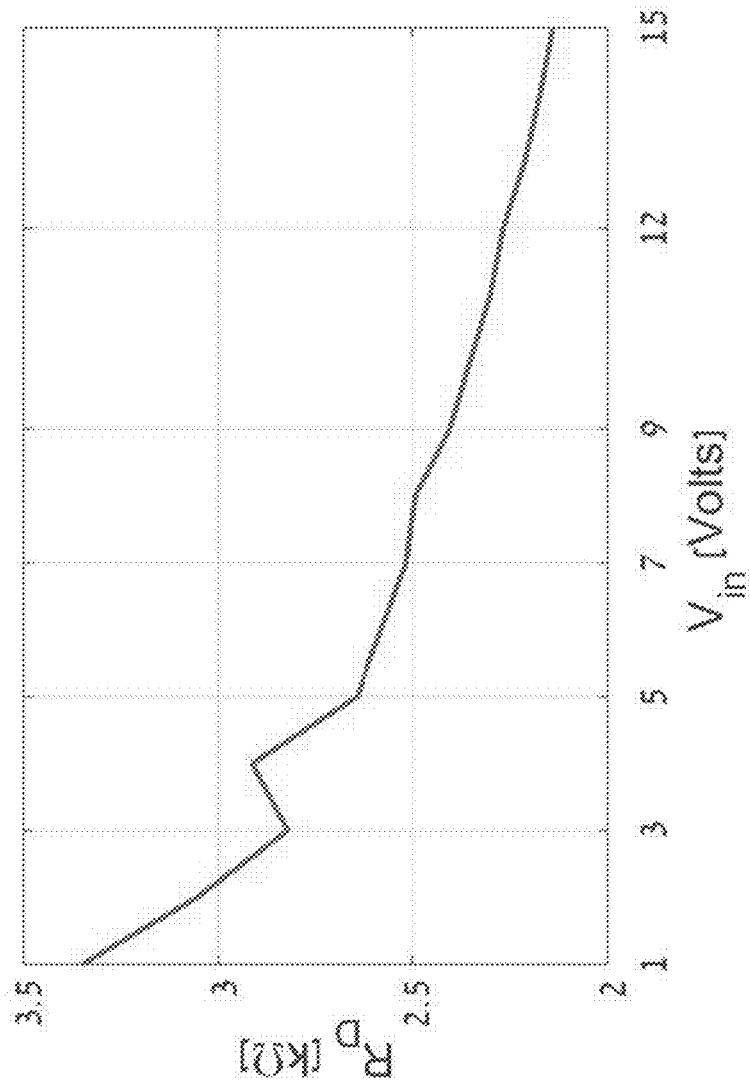
FIG. 12 illustrates the resistance of the switch, according to embodiments of the present invention.

Values of output voltage, Vout were measured for different values of input voltage, Vin. The results are shown in FIG. 12. The resistance of the switch was calculated using the Vin and Vout. The non-linear behavior is readily seen from the plot of resistance vs Vin of FIG. 12.

Although the switch measured was much larger in scale than the switch intended for the structure, and although the material embedded in the capacitor was intrinsic, the conductivity of the materials in the unit-cell was able to be altered. If doped semiconductors are used the conductivity can be expected to increase significantly. When the switch is embedded in the truncated grid structure, and the conductivity passes a certain threshold, the transition from a transmissive structure to a non-transmissive (i.e. reflective) structure will occur.

The aforementioned figures illustrate the architecture, functionality, and operation of possible implementations of systems and apparatus according to various embodiments of the present invention. Where referred to in the above description, an embodiment is an example or implementation of the invention. The various appearances of "one embodiment," "an embodiment" or "some embodiments" do not necessarily all refer to the same embodiments.

Reference in the specification to "some embodiments", "an embodiment", "one embodiment" or "other embodiments" means that a particular feature, structure, or characteristic described in connection with the embodiments is included in at least some embodiments, but not necessarily all embodiments, of the inventions. It will further be recognized that the aspects of the invention described hereinabove may be combined or otherwise coexist in embodiments of the invention.

It is to be understood that the phraseology and terminology employed herein is not to be construed as limiting and are for descriptive purpose only.

The principles and uses of the teachings of the present invention may be better understood with reference to the accompanying description, figures and examples.

It is to be understood that the details set forth herein do not construe a limitation to an application of the invention.

Furthermore, it is to be understood that the invention can be carried out or practiced in various ways and that the invention can be implemented in embodiments other than the ones outlined in the description above.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

Methods of the present invention may be implemented by performing or completing manually, automatically, or a combination thereof, selected steps or tasks.

The term "method" may refer to manners, means, techniques and procedures for accomplishing a given task including, but not limited to, those manners, means, techniques and procedures either known to, or readily developed from known manners, means, techniques and procedures by practitioners of the art to which the invention belongs.

The descriptions, examples and materials presented in the claims and the specification are not to be construed as limiting but rather as illustrative only.

Meanings of technical and scientific terms used herein are to be commonly understood as by one of ordinary skill in the art to which the invention belongs, unless otherwise defined.

The present invention may be implemented in the testing or practice with materials equivalent or similar to those described herein.

While the invention has been described with respect to a limited number of embodiments, these should not be construed as limitations on the scope of the invention, but rather as exemplifications of some of the preferred embodiments. Other or equivalent variations, modifications, and applications are also within the scope of the invention. Accordingly, the scope of the invention should not be limited by what has thus far been described, but by the appended claims and their legal equivalents.

The invention claimed is:

1. A dynamic metasurface optical modulator, comprising:
a plurality of pixels arranged in a grid, said pixels comprising a plurality of unit-cells, said unit-cell comprising a dielectric layer sandwiched between two at least partially conductive layers,
wherein the transmissivity of each of said plurality of pixels is dynamically adjustable between a range comprising a first extremum state where the surface of the pixel is substantially fully transmissive and a second extremum state where the surface of the pixel is substantially fully reflective/absorptive,
wherein the optical characteristics of each of said unit-cells is controlled by the application of a voltage across each of said pixels of the plurality of pixels, and
wherein each of said unit-cells comprises non-linear materials and the dimensional size of each of said unit-cells is smaller than half of the operating wavelength of said dynamic metasurface optical modulator.

2. The dynamic metasurface optical modulator according to claim 1, wherein said partially conductive layers comprise doped semi-conductor material.

3. The dynamic metasurface optical modulator according to claim 1, further comprising a capacitor structure in a plane perpendicular to said conductive layers.

4. The dynamic metasurface optical modulator according to claim 3, wherein said capacitor structure comprises two layers of a partially conductive material.

5. The dynamic metasurface optical modulator according to claim 3, wherein said capacitor structure comprises two layers of non-transparent material.

6. The dynamic metasurface optical modulator according to claim 3, wherein said capacitor structure comprises a layer of semi-conductor material between two layers of transparent material.

7. The dynamic metasurface optical modulator according to claim 4, wherein said capacitor structure comprises two layers of at least one of the following materials: indium tin oxide; aluminum doped Zinc oxide (AZO); Indium doped cadmium oxide (ICO); Polymers: Poly(3,4-ethylenedioxythiophene) (PEDOT); Poly(4,4-dioctyl cyclopentadithiophene) can be doped with iodine or 2,3-dichloro-5,6-dicyano-1,4-benzoquinone (DDQ); Carbon nanotubes (CNT); and Graphene.

8. The dynamic metasurface optical modulator according to claim 5, wherein said non-transparent material comprises one of: silicon; germanium; gallium arsenide; and silicon carbide.

9. The dynamic metasurface optical modulator according to claim 1, wherein said application of a voltage across said pixel is varied to vary an electric field strength across said unit-cell.

10. The dynamic metasurface optical modulator of claim 1, wherein a dimensional size of each of said plurality of unit-cells is smaller than $\lambda/3$ at an operating wavelength $\lambda$ of said dynamic optical modulator.

11. The dynamic metasurface optical modulator of claim 1, wherein each of said plurality of unit-cells are smaller than $\lambda/4$ at an operating wavelength $\lambda$ of said dynamic optical modulator.

* * * * *